United States Patent [19]
Goldman

[11] Patent Number: 6,081,165
[45] Date of Patent: Jun. 27, 2000

[54] RING OSCILLATOR

[75] Inventor: Stanley J. Goldman, Dallas, Tex.

[73] Assignee: Texas Instruments Incorporated, Dallas, Tex.

[21] Appl. No.: 09/118,473

[22] Filed: Jul. 17, 1998

Related U.S. Application Data

[60] Provisional application No. 60/053,818, Jul. 25, 1997.

[51] Int. Cl.[7] .................................................. H03B 27/00
[52] U.S. Cl. ............................ 331/57; 331/175; 327/261; 327/264
[58] Field of Search ..................... 331/57, 175; 327/161, 327/261, 264

[56] References Cited

U.S. PATENT DOCUMENTS 5,461,591  10/1995  Kim et al. ................................ 327/534

*Primary Examiner*—Arnold Kinkead
*Attorney, Agent, or Firm*—Robert D. Marshall, Jr.; Gerald E. Laws; Richard L. Donaldson

[57] ABSTRACT

An improved ring oscillator (10, 70) includes a first, second and third current starved inverters (12, 14, 16) coupled in a ring, a first fast inverter (40) coupled between the second and third current starved inverters (14, 16), and a second fast inverter (45) coupled between the third and first current starved inverters (14, 16). An output buffer (30) coupled to the ring provides an output periodic waveform.

12 Claims, 2 Drawing Sheets

RING OSCILLATOR

This application claims priority under 35 USC 119 (e) (1) of provisional application No. 60/053,818, filed Jul. 25, 1997.

TECHNICAL FIELD OF THE INVENTION

This invention is related in general to the field of electronic circuits. More particularly, the invention is related to an improved ring oscillator.

BACKGROUND OF THE INVENTION

In the typical ring oscillator configuration, three inverters operating in a current starved mode are connected in a ring. The gate capacitances of the inverters are sequentially charged and discharged. Decreasing the peak available charging current increases the time to charge and discharge the gate capacitance and thus decreases the frequency of the generated periodic output waveform. Current starving the inverters in the ring slows down the output waveform edges of the inverters and keeps the transistors forming the inverters operating in a linear analog region. A linear analog oscillation mode exists if the ring oscillator operates in the linear region all of the time, if the electric length around the ring equals zero degrees, and if the gain around the ring is greater than zero dB. When the linear analog oscillation mode exists, the output periodic waveform of the ring oscillator exhibits a second higher oscillation frequency or non-harmonically related spurs or jitter. This phenomenon has been termed "moding" in the industry. Further, the two modes of oscillation at two frequencies may exhibit an injection locking condition that results in unpredictable behavior in the output waveform frequency.

Because ring oscillators are used as the voltage controlled oscillator in phase locked loop circuits commonly used in many industrial, automotive, and telecommunications applications, unpredictable behaviors such as moding and injection locking are highly undesirable.

SUMMARY OF THE INVENTION

Accordingly, there is a need for an improved ring oscillator that does not exhibit the undesirable moding behavior.

In accordance with the present invention, an improved ring oscillator is provided which eliminates or substantially reduces the disadvantages associated with prior ring oscillators.

In one aspect of the invention, an improved ring oscillator includes a first, second and third current starved inverters coupled in a ring, a first switch coupled between the second and third current starved inverters and a second switch coupled between the third and first current starved inverters. An output buffer coupled to the ring provides an output periodic waveform.

In another aspect of the invention, an improved ring oscillator includes first, second and third current starved CMOS inverters coupled in a ring, a first switch coupled between the second and third current starved inverters, and a second switch coupled between the third and first current starved inverters. The first and second switches each includes a pMOS transistor coupled to a power supply voltage, and an nMOS transistor coupled to the pMOS transistor and ground. An output buffer is further coupled to the ring for outputting a periodic waveform.

In yet another aspect of the invention, a method for improving a ring oscillator which has a first, second and third current starved inverters coupled in a ring configuration includes the steps of inserting a first switch between the second and third inverters, inserting a second switch between the third and first inverters, and closing the first and second switches at different times so that there is always a discontinuity in the ring configuration. A periodic waveform is outputted between the second switch and the third current starved inverter.

BRIEF DESCRIPTION OF THE DRAWINGS

For a better understanding of the present invention, reference may be made to the accompanying drawings, in which.

DETAILED DESCRIPTION OF THE INVENTION

Figure 1:
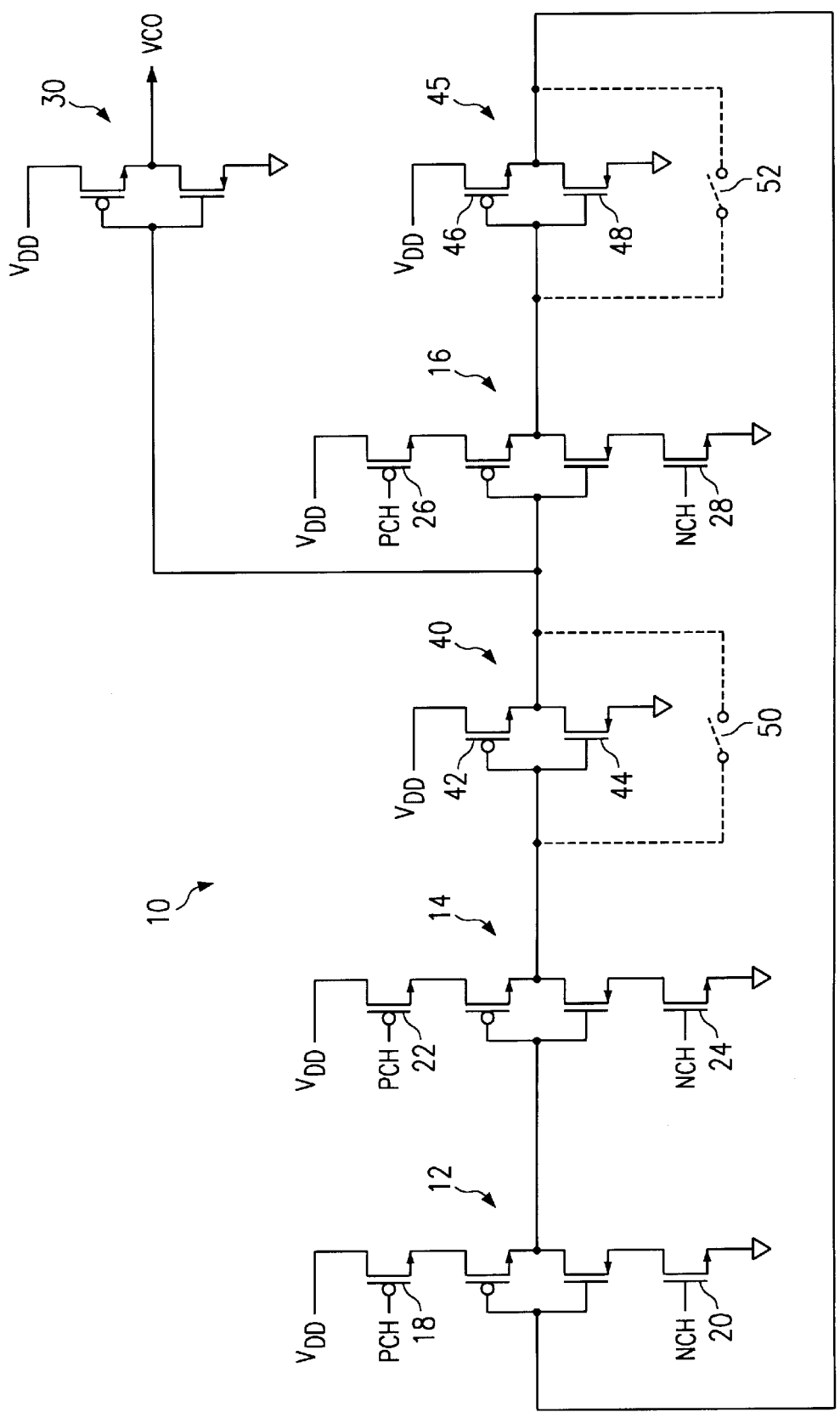
FIG. 1 is a schematic diagram of an embodiment of an improved ring oscillator according to the teachings of the present invention.
Figure 2:
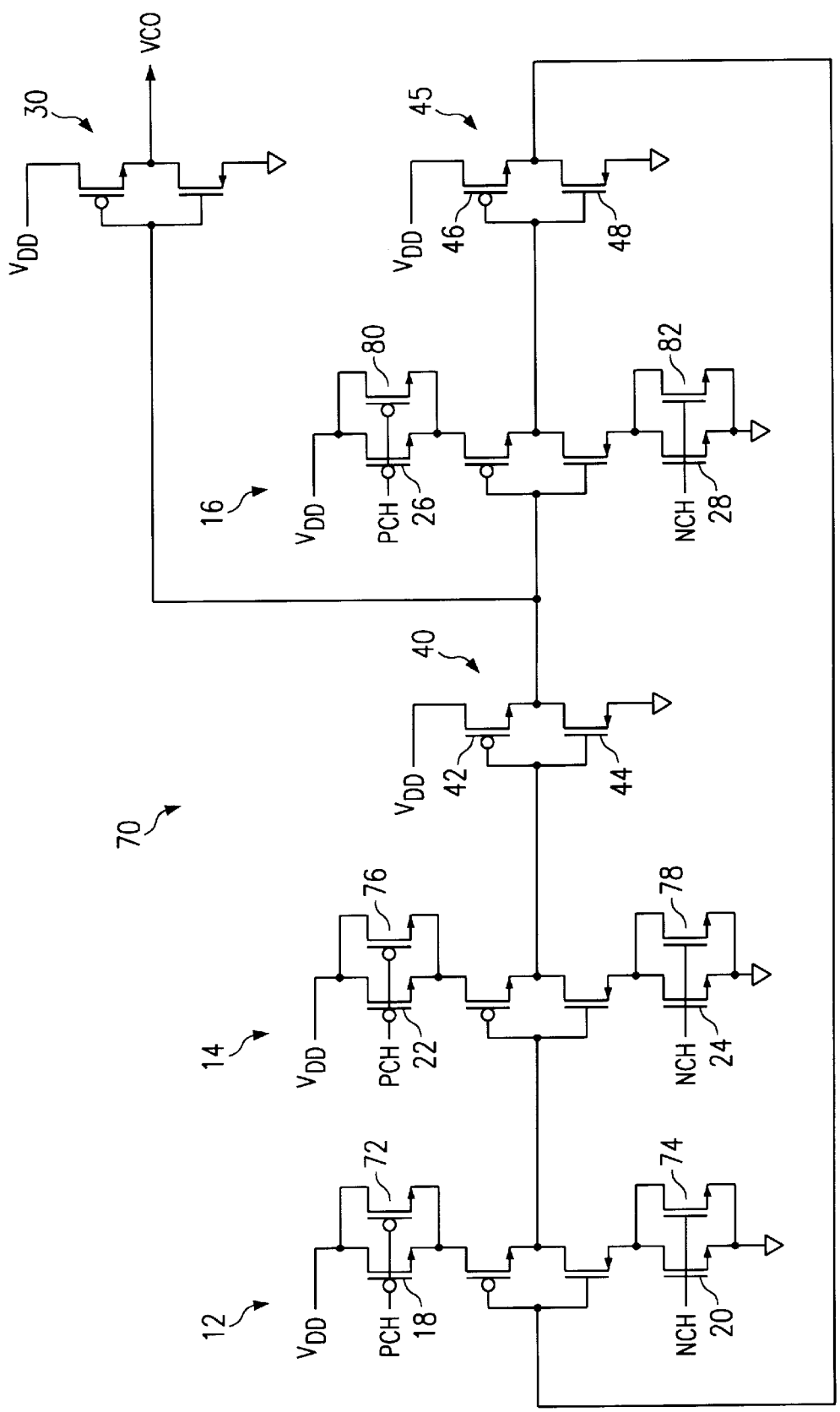
FIG. 2 is a schematic diagram of a second embodiment of an improved ring oscillator according to the teachings of the present invention.

The preferred embodiments of the present invention are illustrated in FIGS. 1 and 2, like reference numerals being used to refer to like and corresponding parts of the various drawings.

Referring to FIG. 1, a embodiment of an improved ring oscillator 10 constructed according to the teachings of the present invention is shown. Improved oscillator 10 is a CMOS circuit which includes a first, second and third inverters 12–16 coupled in series. Inverter 12 is further coupled to a power supply voltage, $V_{DD}$, through a pMOS transistor 18 and to ground through an NMOS transistor 20. Similarly, inverter 14 is also coupled to $V_{DD}$ through a pMOS transistor 22, and to ground through an nMOS transistor 24. Inverter 16 is coupled to $V_{DD}$ through a pMOS transistor 26, and to ground through an nMOS transistor 28. Bias voltages, PCH and NCH, are maintained at levels sufficient to turn on the respective pMOS and nMOS transistors coupled to each inverter 12–16 that function to change the rate at which the gate capacitances of each inverter charge and discharge. Inverters 12–16 operate in a current starved mode by adjusting the bias voltage levels, PCH and NCH. In addition, an output buffer 30 is coupled between second and third inverters 14 and 16 from which an output periodic waveform, VCO, is generated.

The circuit described above is a typical ring oscillator configuration which suffers from undesirable moding and injection locking conditions. According to the teachings of the present invention, two fast buffers 40 and 45 are inserted in the ring oscillator to cut off the analog oscillation mode by limiting the amount of time the oscillator spends in the linear region. Fast inverter 40 includes a pMOS transistor 42 coupled to an nMOS transistor 44 between $V_{DD}$ and ground. Fast inverter 40 is coupled between second and third inverter 14 and 16. Fast inverter 45 is coupled between third inverter 16 and first inverter 12. Fast inverter 45 includes a pMOS transistor 46 and an nMOS transistor 48 coupled between $V_{DD}$ and ground.

In operation, fast inverters 40 and 45 function as switches 50 and 52 (shown for illustration purposes only). For an oscillation mode at 220 MHZ with a 45 ns period and a fast inverter edge of 0.5 ns, the fast inverter is in the linear region for only 3.6 degrees of the 220 MHZ oscillation. Consequently, it is not in the linear region long enough for the analog oscillation mode to get excited. Further disruption of the analog oscillation mode is obtained by staggering fast inverters 40 and 45 to switch (open and close) at different times. Because switches 50 and 52 never close at the same time, the analog feedback loop is thus disconnected.

FIG. 2 is a schematic diagram of a second embodiment of an improved ring oscillator 70 constructed according to the teachings of the present invention. In addition to fast inverters 40 and 45 inserted into the ring, parallel transistors are added to primarily increase the operating frequency of the ring oscillator which may be reduced by the addition of fast inverters 40 and 45. Inverter 12 is coupled to parallel pMOS transistors 18 and 72 and parallel nMOS transistors 20 and 74. Inverter 14 is coupled to parallel pMOS transistors 22 and 76 and parallel nMOS transistors 24 and 78. Inverter 16 is coupled to parallel pMOS transistors 26 and 80 and parallel nMOS transistors 28 and 82. The parallel pMOS and nMOS transistors are gated by the same PCH and NCH voltage levels, respectively. Typically, the frequency of output periodic waveform is increased by nearly a factor of two.

Accordingly, by inserting two fast inverters in the ring oscillator, problems such as moding and injection locking encountered by typical current starved ring oscillators are resolved. Further, optional parallel transistors may be added to improve the operating frequency of the circuit.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. An improved ring oscillator, comprising:
    first, second and third current starved inverters coupled in a ring;
    a first fast inverter coupled between the second and third current starved inverters;
    a second fast inverter coupled between the third and first current starved inverters, said first and second fast inverters having a speed of operation to conduct in a linear region insufficiently long at a frequency of operation of said ring oscillator to excite an analog oscillation mode; and
    an output buffer coupled to the ring oscillator and outputting an output periodic waveform.

2. The improved ring oscillator, as set forth in claim 1, wherein the first, second and third current starved inverters each comprises:
    a pMOS transistor coupled to a power supply voltage; and
    an nMOS transistor coupled to the pMOS transistor and ground.

3. The improved ring oscillator, as set forth in claim 2, wherein the first, second and third current starved inverters each further comprises:
    a second pMOS transistor coupled between the power supply voltage and the pMOS transistor, and being gated by a first predetermined bias voltage; and
    a second nMOS transistor coupled between the nMOS transistor and ground, and being gated by a second predetermined bias voltage.

4. The improved ring oscillator, as set forth in claim 3, wherein the first, second and third current starved inverters each further comprises:
    a third pMOS transistor coupled in parallel with the second pMOS transistor and between the power supply voltage and the pMOS transistor, and being gated by the first predetermined bias voltage; and
    a third nMOS transistor coupled in parallel with the second nMOS transistor and between the nMOS transistor and ground, and being gated by the second predetermined bias voltage.

5. The improved ring oscillator, as set forth in claim 1, wherein the first fast inverter comprises:
    a pMOS transistor coupled to a power supply voltage; and
    an nMOS transistor coupled to the pMOS transistor and ground.

6. The improved ring oscillator, as set forth in claim 1, wherein the second fast inverter comprises:
    a pMOS transistor coupled to a power supply voltage; and
    an nMOS transistor coupled to the pMOS transistor and ground.

7. The improved ring oscillator, as set forth in claim 1, wherein the first and second fast inverters do not conduct simultaneously.

8. An improved ring oscillator, comprising:
    first, second and third current starved CMOS inverters coupled in a ring;
    a first switch coupled between the second and third current starved inverters;
    a second switch coupled between the third and first current starved inverters; said first and second switches closing at different times thereby not exciting an analog oscillation mode in said ring oscillator;
    wherein the first and second switches each comprises:
        a pMOS transistor coupled to a power supply voltage; and
        an nMOS transistor coupled to the pMOS transistor and ground; and
    an output buffer coupled to the ring oscillator and outputting an output periodic waveform.

9. The improved ring oscillator, as set forth in claim 8, wherein the first, second and third current starved inverters each comprises:
    a CMOS inverter;
    a pMOS transistor coupled between a power supply voltage and the inverter, and being gated by a first predetermined bias voltage; and
    an nMOS transistor coupled between the inverter and ground, and being gated by a second predetermined bias inverter.

10. The improved ring oscillator, as set forth in claim 9, wherein the first, second and third current starved inverters each further comprises:
    a second pMOS transistor coupled in parallel with the pMOS transistor and between the power supply voltage and the inverter, and being gated by the first predetermined bias voltage; and
    a second nMOS transistor coupled in parallel with the nMOS transistor and between the inverter and ground, and being gated by the second predetermined bias voltage.

11. The improved ring oscillator, as set forth in claim 8, wherein the first and second switches do not close simultaneously.

12. An improved ring oscillator, comprising:
    a first current starved inverter having an input and an output;

a second current starved inverter having an input connected to said output of said first current starved inverter and an output;

a first fast inverter having an input coupled to said output of said second current starved inverter and an output, said first fast inverter having a speed of operation to conduct in a linear region insufficiently long at a frequency of operation of said ring oscillator to excite an analog oscillation mode;

a third current starved inverter having an input connected to said output of said first fast inverter and an output;

a second fast inverter having an input coupled to said output of said third current starved inverter and an output connected to said input of said first current starved inverter, said second fast inverter having a speed of operation to conduct in a linear region insufficiently long at a frequency of operation of said ring oscillator to excite an analog oscillation mode; and an output buffer coupled to the ring oscillator and outputting an output periodic waveform.

* * * * *